United States Patent
Osman et al.

(10) Patent No.: US 7,382,193 B2
(45) Date of Patent: Jun. 3, 2008

(54) PRESERVING LINEARITY OF AN ISOLATOR-FREE POWER AMPLIFIER BY DYNAMICALLY ADJUSTING GAIN AND PHASE

(75) Inventors: Saleh Osman, Norwood, MA (US); Richard F. Keenan, Whitinsville, MA (US); Jaroslaw Lucek, Cumberland, RI (US)

(73) Assignee: NXP B.V., Eindhoven (NL)

( * ) Notice: Subject to any disclaimer, the term of this patent is extended or adjusted under 35 U.S.C. 154(b) by 213 days.

(21) Appl. No.: 10/538,632

(22) PCT Filed: Dec. 10, 2003
(Under 37 CFR 1.47)

(86) PCT No.: PCT/IB03/05938

§ 371 (c)(1),
(2), (4) Date: Feb. 9, 2006

(87) PCT Pub. No.: WO2004/054097

PCT Pub. Date: Jun. 24, 2004

(65) Prior Publication Data

US 2007/0146074 A1    Jun. 28, 2007

Related U.S. Application Data

(60) Provisional application No. 60/432,897, filed on Dec. 12, 2002.

(51) Int. Cl.
*H03G 3/00* (2006.01)
(52) U.S. Cl. .................. 330/278; 330/107; 330/149
(58) Field of Classification Search ............ 330/107, 330/310, 98, 133, 150, 278, 149
See application file for complete search history.

(56) References Cited

U.S. PATENT DOCUMENTS

| 4,312,032 | A | | 1/1982 | Kirby |
| 5,423,082 | A | | 6/1995 | Cygan |
| 5,442,322 | A | | 8/1995 | Kornfeld |
| 5,712,593 | A | | 1/1998 | Buer |
| 5,977,831 | A | * | 11/1999 | Davis et al. ............... 330/279 |
| 6,064,266 | A | | 5/2000 | Anderson |
| 6,069,530 | A | * | 5/2000 | Clark ........................ 330/149 |
| 6,424,216 | B2 | * | 7/2002 | Mu et al. ................. 330/207 P |
| 2002/0171485 | A1 | * | 11/2002 | Cova ......................... 330/149 |

* cited by examiner

*Primary Examiner*—Robert Pascal
*Assistant Examiner*—Hieu P Nguyen
(74) *Attorney, Agent, or Firm*—Peter Zawilski

(57) ABSTRACT

An amplifier circuit (100) includes a driver stage ( ) 120 with at least an active device (140) for pre-amplification and output of a pre-amplified signal; and an output stage (160) with at least an active device (180) for further amplification of the pre-amplified signal and output of an amplified signal. A phase shifter (155) shifts the phase of the pre-amplified signal. A detector (190) measures levels of forward and reflected parts of the amplified signal, and a gain and phase control circuit (145) independently and selectively controls and adjusts the phase shifter (155) for optimal amplifier performance and minimal difference between the forward and reflected signals. The gain and phase control circuit also independently and selectively controls and modifies the gain of the active devices (140, 180) of the driver and output stages (120, 160) as a function of the levels of the forward and reflected signals to substantially maintain constant linearity of the amplifier circuit (100) with load variations.

16 Claims, 3 Drawing Sheets

PRESERVING LINEARITY OF AN ISOLATOR-FREE POWER AMPLIFIER BY DYNAMICALLY ADJUSTING GAIN AND PHASE

CROSS REFERENCE TO RELATED APPLICATION

This application claims the benefit of U.S. provisional application Ser. No. 60/432,897 filed Dec. 12, 2002, which is incorporated herein by reference.

The invention relates to an isolator-free power amplifier circuit typically used in wireless communication devices which preserves linearity of the power amplifier under varying loads. More particularly, linearity is preserved by dynamically adjusting the gain by changing the input bias of active devices of the power amplifier circuit, and/or by dynamically adjusting the phase of a pre-amplified signal.

The invention relates to an isolator-free power amplifier circuit typically used in wireless communication devices which preserves linearity of the power amplifier under varying loads. More particularly, linearity is preserved by dynamically adjusting the gain by changing the input bias of active devices of the power amplifier circuit, and/or by dynamically adjusting the phase of a pre-amplified signal.

Power amplifiers are used in transmitters to amplify signals, such as radio frequency (RF) signals. Such power amplifiers are included in transmitters of wireless communication devices, such as mobile telephones. The power amplifier typically provides an amplified RF signal to an antenna for transmission over the air.

RF antennas as for instance applied in mobile phones, operate in strongly varying environments, resulting in a varying antenna input impedance, a VSWR (Voltage Standing Wave Ratio) of 4:1 is not uncommon. Especially at high output levels, this may result in a severe distortion of for instance a CDMA (code division multiple access), TDMA (time division multiple access), Edge or W-CDMA modulated carrier signal having a non-constant envelope.

The conventional solution to protect the power amplifier of a cellular phone against antenna mismatch conditions to preserve linearity is to use an isolator, such as a circulator, placed between the power amplifier and the output load, such as the antenna, to limit the effects of load impedance variation on the performance of the power amplifier. The circulator secures proper 50 Ohm loading of the power amplifier under antenna mismatch conditions by dissipating the reflected power in the isolator or in a third circulator port termination. Directivity in the power flow is created by ferromagnetic material.

The above aspects of the state of the art are described in more detail with reference to FIG. 1 which shows a basic block diagram of an arrangement 10 used for a power source 12 isolated with a circulator 14 from a mismatched antenna 16. A current source 18 and its impedance $Z_o$ represent an ideal power source (RF-transistor) 12. A matching circuit 20 is connected between the antenna 16 and power source 12, with another terminal 22 connected to ground.

Part of the power $P_{inc\_circ}$ from the matching circuit 20 to the circulator 14 is delivered as $P_{inc\_ant}$ to the antenna 16 where some power is reflected back $P_{refl\_ant}$ to the circulator 14. Thanks to the circulator 14, the reflected power $P_{refl\_ant}$ from the antenna 16 is not reflected towards the source 12, but dissipated into the circulator load $P_{diss}$. Consequently, the reflected power $P_{refl\_circ}$ from the circulator 14 and the reflected power $P_{refl\_source}$ from the matching circuit 20 towards the source 12 are zero. This avoids extremes that would occur when incident and reflected waves add up in-phase. However, since it is desired to preserve power amplifier linearity and maintain Prad constant (under control of field strength indication at the base station), then the incident power $P_{inc\_source}$ from the source 12 has to be increased, thus increasing power dissipation, to overcome reflection losses resulting in enhanced signal voltage and current at the source 12. Thus, the circulator 14 only partly preserves power amplifier linearity under antenna mismatch conditions. In addition, power dissipation and consumption remains high thus requiring battery charging and decreasing battery life of the mobile phone as well as decreasing efficiency.

It is desirable to remove the isolator or circulator 14 connected to the antenna 16. However, removal of the isolator allows load impedance variations to detrimentally affect the performance, e.g., linearity, of the power amplifier. Accordingly, there is a need to have a power amplifier circuit where the isolator is removed yet the performance and linearity of the amplifier is preserved despite load impedance variations.

According to the invention, linear power output of a power amplifier is substantially maintained constant despite load variations and having no isolator connected to the load. This is achieved by dynamically adjusting the gain of active devices and phase of signals in an isolator-less power amplifier circuit as a correction scheme for linearity under predetermined load mismatch conditions. Thus, linear output power is kept unchanged for a predetermined load delta across the dynamic range of operation, without substantially decreasing efficiency. More particularly, linearity is substantially maintained constant despite load variations by independently and selectively adjusting the gain of the active devices of driver and output stages as a function of the levels of the forward and reflected output signals. Further, the phase of a pre-amplified signal is independently and selectively adjusted as a function of the levels of the forward and reflected output signals to substantially maintain constant linearity of amplifier circuit with load variations.

In one embodiment according to the present invention, an amplifier circuit for preserving linearity of an amplifier is provided. The amplifier circuit may be used in wireless communication devices, for example. The amplifier circuit includes a driver stage with at least an active device for pre-amplification and output of a pre-amplified signal; and an output stage with at least an active device an active device for further amplification of the pre-amplified signal and output of an amplified signal. A phase shifter shifts the phase of the pre-amplified signal. A detector measures levels of forward and reflected parts of the amplified signal, and a gain and phase control circuit independently and selectively controls and adjusts the phase shifter for optimal amplifier performance and maximum difference or ratio between the forward and reflected signals. The gain and phase control circuit also independently and selectively controls and modifies the gain of the active devices of the driver and output stages as a function of the levels of the forward and reflected signals to substantially maintain linearity of amplifier circuit with load variations.

In another embodiment according to the present invention, a method for substantially preserving linearity of an amplifier under varying loads is provided. The method includes measuring levels of forward and reflected signals at the amplifier output; and adjusting the phase of a pre-amplified signal for optimal amplifier performance and maximum difference or ratio difference between the forward and reflected signals as a function of the measured levels, such as the difference or ratio of the measured forward and reflected signals. The method further includes independently and selectively adjusting the gain of the active devices of the driver stage and/or output stage, such as by selectively adjusting the DC bias at the input of the active devices, as a function of the levels of the forward and reflected signals to substantially maintain linearity of amplifier circuit with load variations.

Further features and advantages of the invention will become more readily apparent from a consideration of the following description.

The accompanying drawings specify and show preferred embodiments of the invention, wherein like elements are designated by identical references throughout the drawings; and in which.

The invention, together with attendant advantages, will be best understood by reference to the following detailed description of the preferred embodiment of the invention, taken in conjunction with the accompanying drawing.

An amplifier circuit for use in wireless communication devices for example is described where, illustratively, an RF power amplifier is used in RF antenna circuits. In the following description, numerous specific details are set forth, such as specific type and number of transistors, in order to provide a thorough understanding of the present invention. However, it will be obvious to one skilled in the art that the present invention may be practiced without these specific details. In other instances, well known circuits have not been set forth in detail in order to not unnecessarily obscure the present invention.

Figure 1:
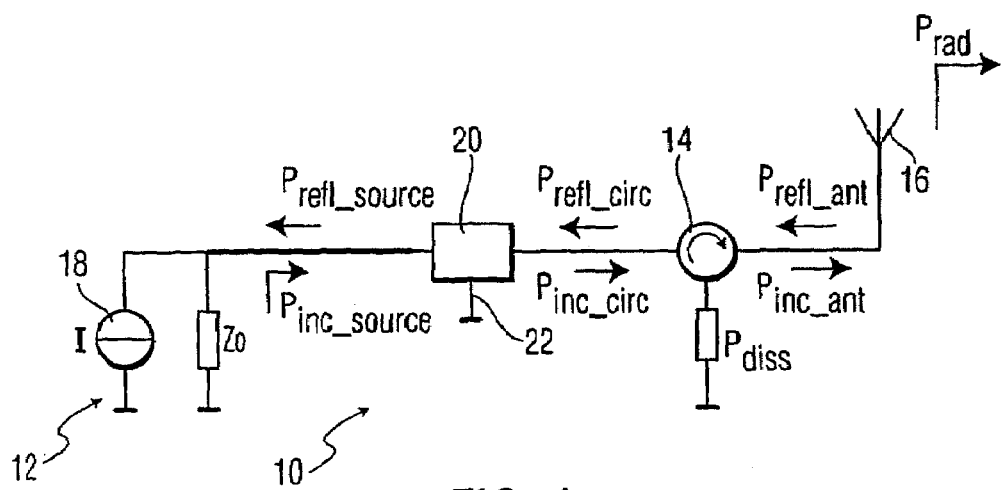
FIG. 1 shows a prior art block diagram of a power source isolated with a circulator from a mismatched antenna.
Figure 2:
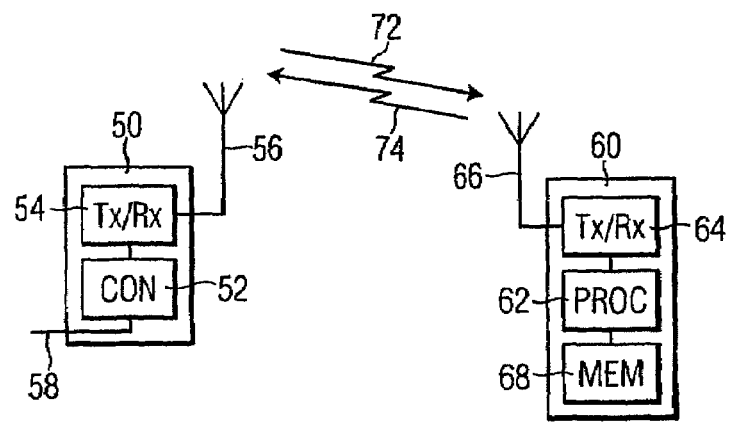
FIG. 2 shows a wireless communication system according to the present invention.
Figure 2:
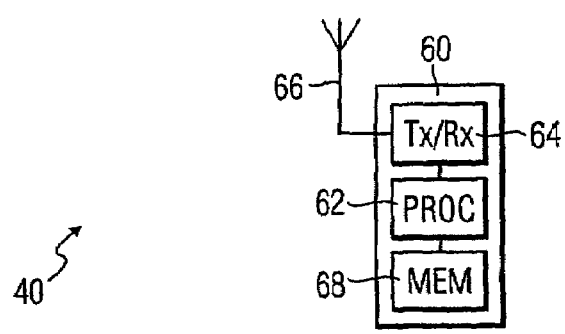

The wireless communication device may be for example a mobile cellular or cordless telephone, pager, an Internet appliance or other consumer devices, and is typically part of a communication system. FIG. 2 shows a wireless communication system, such as a mobile telephone system 40 comprising a primary or base station (BS) 50 and a plurality of secondary or mobile stations (MS) 60. The BS 50 comprises a network controller 52, such as a computer, coupled to a transceiver 54 which is in turn coupled to radio transmission means such as an antenna 56. A connection means such as a wire 58 couples the controller 52 to a public or a private network.

Each MS 60 comprises a processor 62 such as a microcontroller (μC) and/or a digital signal processor (DSP). Typically, the DSP processes voice signals, while the μC manages operation of the MS 60. The processor 62 is coupled to a transceiver means 64 coupled to radio transmission means, e.g., an antenna 66. A memory 68, such as an EPROM and RAM, is coupled to the processor 62 and stores data related to operation and configuration of the MS 60. Communication from the BS 50 to MS 60 takes place on a downlink channel 72, while communication from the MS 60 to BS 50 takes place on an uplink channel 74. The MS 60 also includes a user interface such as a keyboard and a screen, as well as a microphone coupled to the transmit branch or section of the transceiver 64 and a speaker coupled to the receiver section of the transceiver 64.

The transmit section of the transceiver 64 transmits signals over the uplink channel 74, which the receive branch of the transceiver 64 receives signals over the downlink channel 72. The transceiver 64 includes a selection means to selectively couple a power amplifier (PA) of the transmit section or a low noise amplifier (LNA) of the receive section to the antenna 66. Illustratively, the selection means includes a duplexer or bandpass filters tuned to the transmit and receive frequency ranges, respectively. As is well known in the art, the transceiver 64 also includes other circuits such as a down converter for converting the received radio frequency (RF) signals to intermediate frequency and/or baseband signals, and demodulator/decoder in the receive branch. By contrast, the transmit branch of the transceiver 64 includes an up converter and a modulator/encoder. Converters that convert between analog and digital formats are also typically present in the transceiver 64.

Figure 3:
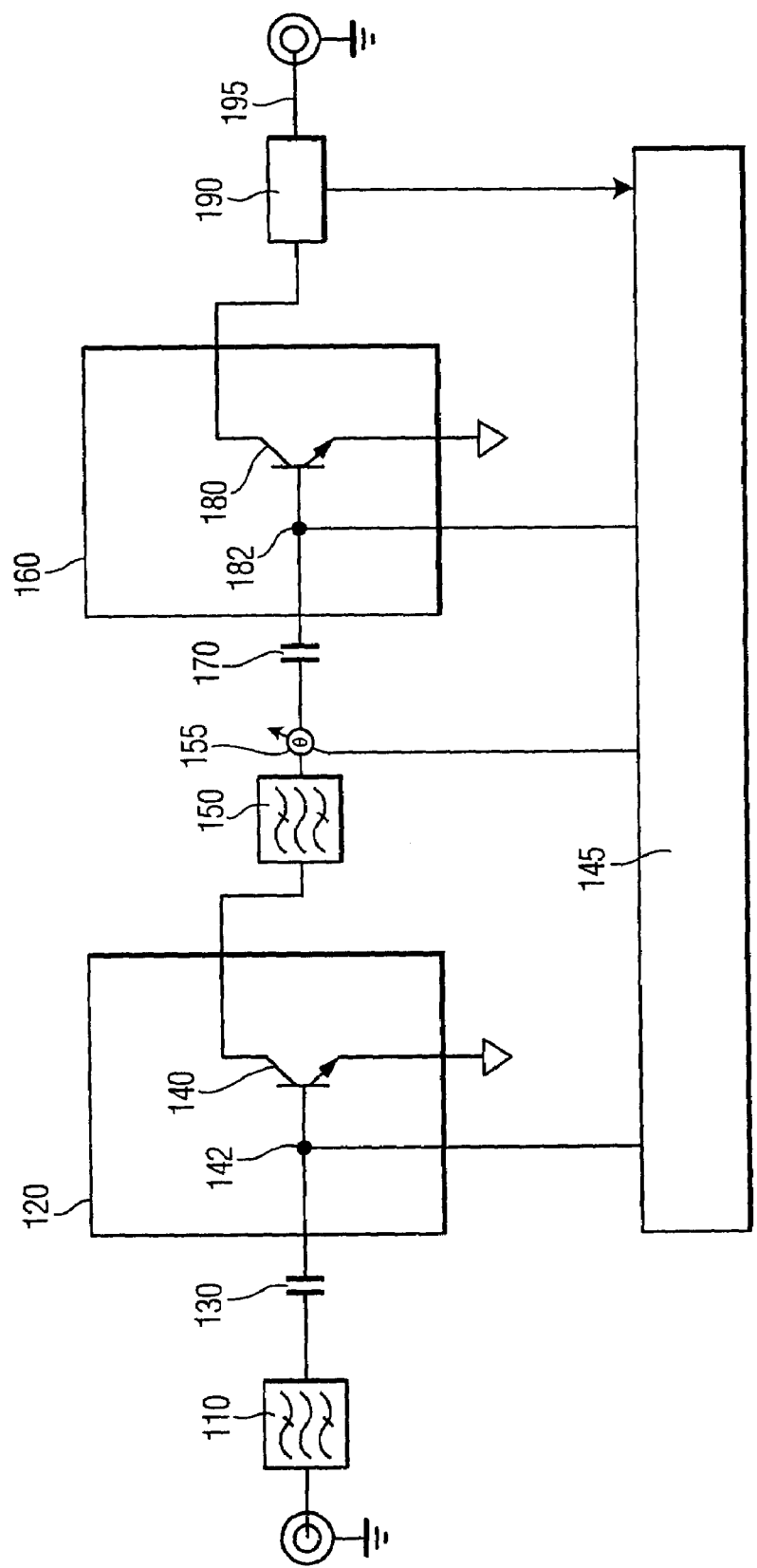
FIG. 3 shows an isolator-free amplifier circuit according to the present invention.

FIG. 3 shows an embodiment of an amplifier circuit 100 according to the present invention which is illustratively used as a power amplifier circuit to amplify RF signals in wireless communication devices. For example, the amplifier circuit 100 is part of the transceiver 64 of the MS 60 shown in FIG. 2, and more particularly, in the transmit branch of the transceiver 64. Typically, the input of the amplifier circuit is coupled to a modulator and receives modulated RF signals for amplification. The amplifier output is coupled to a load, such as the antenna 66, where the amplified RF signals are transmitted over the air on the uplink channel 74 for example.

As shown in FIG. 3, the amplifier circuit 100 comprises an input match circuit 110 for buffering the input of the amplifier circuit 100 and matching its input impedance with the output impedance of the circuit coupled thereto, such as a modulator. The output of the input match circuit 110 is coupled to a driver stage 120 through at least one direct current (DC) blocking capacitor 130. The signal to be amplified, such as a modulated signal, is provided by the input match circuit 110 to the capacitor 130, which substantially blocks DC components and provides a signal substantially without a DC offset to the driver stage 120.

The driver stage 120 comprises at least one active device, such as a transistor 140, which receives the substantially DC-free signal from the capacitor 130 for pre-amplification to a first level. Illustratively, the pre-amplification transistor is a bipolar transistor, such as an NPN transistor 140 having a base 142 coupled to the capacitor 130. The base 142 is further independently coupled to a gain and phase control circuit 145 for a proper DC biasing signal. This allows the control circuit 145 to control, e.g., adjusts the DC bias at the input of the transistor 140. The emitter of the transistor 140 is coupled to ground, while the output or collector of the transistor 140 is coupled to an inter-stage match circuit 150 for buffering and impedance matching between the driver stage 120 and the input 182 of an output stage 160.

The pre-amplified signal from the driver stage 120 is provided to the input 182 of the output stage 160 through the inter-stage match circuit 150, a phase shifter 155 which shifts the phase of the pre-amplified signal, and at least one DC blocking capacitor 170 for substantially blocking DC signals present in the pre-amplified and phase-shifted signal, similar to the DC blocking capacitor 130.

The output stage 160 is similar to the driver stage 120 and also comprises at least one transistor 180 which receive the substantially DC-free signal from the capacitor 170 for amplification to the output level. Illustratively, the output transistor 180 is a bipolar transistor, such as an NPN transistor having a base coupled to the capacitor 170. The base 182 of the output transistor 180 is further coupled to the control circuit 145 for providing the proper DC biasing signal the output transistor 180. The emitter of transistor 180 is coupled to ground, while the output or collector of the transistor 180 is directly or indirectly coupled to the load without any isolation therebetween. Further, the emitter area of each active device 140, 180 is selected such that optimum performance is achieved for a given load, inter-stage and source conditions.

In addition to being coupled to the inputs 142, 182 of the transistors 140, 180, the control circuit 145 is also coupled to a control port of the phase shifter 155. Accordingly, the control circuit 145 is configured to provide control signals for independently and selectively controlling the phase shifter 155 and transistors 140, 180. This allows the bias control circuit 1 independently and selectively adjust the amount phase shifting of the pre-amplified signal and the DC bias at the input transistors 140, 180, thus adjusting the amplification or gain of the driver and output stages 120, 160.

By way of example, suppose a power amplifier is to deliver 30 dBm of output power to a 50 ohm load. If the power amplifier's final stage's output has peak voltage swing of 1.4 volts for linear operation, then a loss-less impedance matching network separating load and power amplifier must have an impedance transformation ratio of 51:1.

Figure 4:
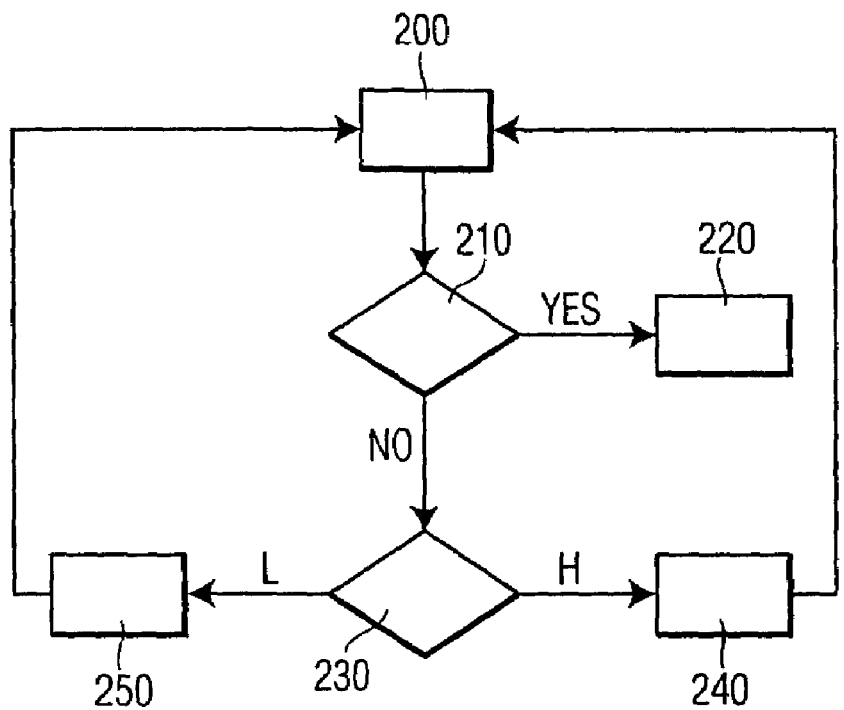
FIG. 4 shows a flow chart of a method for preserving performance, e.g., linearity, of an isolator-free amplifier circuit according to the present invention.

Consider a worst case mismatch condition over all phases of a constant VSWR. The two impedance extremes are high and low loads. In the former case, large voltage swings develop across the output of the final stage causing non-linearity in the form of clipping due to the onset of high AC impedance. In the later case, the demand for output current elevates due to the onset of low AC impedance. By monitoring the incident and reverse power levels, a measurement of the impedance condition is obtained as shown in block 200 of FIG. 4. Next in block 210, the impedance level or mismatch is checked and if a normal or matched level is obtained, then normal matched operation is continued in block 220. If the impedance level or mismatch is not normal, then it is determined in block 230 whether the difference or ratio of the measured forward and reflected signals is high, indicating a relatively high forward signal, or low indicating a relatively low forward signal. Next, in block 240, the phase shifter and the input DC bias of each driver and output transistor are independently and selectively adjusted in one direction or the other, depending on whether the ratio measured in block 230 was high or low. Next, the impedance condition is re-measured by returning to block 200 and the operations are repeated until a matched level is obtained in block 210 and normal matched operation is continued in block 220. The monitoring and measurement of the impedance in block 200 are continuously or intermittently checked and adjustments are made, if needed, to arrive to the matched condition of block 220.

A detector, such as a power detector 190, is also coupled to the output of transistor 180 for detecting the level, e.g., the power level, of the amplified RF signal at the output of the output stage 160. The power detector 190 is in turn coupled to the control circuit 145. The output 195 of the amplifier circuit 100 is coupled to an antenna without an isolator therebetween.

The power detector 190 provides the control circuit 145 a measure of the forward and reflected output power of the amplifier circuit 100. As a function of the forward and reflected power levels, the control circuit 145 independently and selectively controls the phase shifter 155 and each of transistor 140, 180 of the driver and output stages 120, 160 to substantially maintain the optimum performance and constant linearity of the amplifier circuit 100 despite variations in the impedance of the load connected to the output 195 of the amplifier circuit 100. For example, in response to the difference between the forward and reflected power level in response to the difference between the forward and reflected power level, the control circuit 145 independently and selectively controls the phase shifter 155 and changes the DC bias on the input e.g., base 142, 182, of each driver and output transistor 140, 160. This substantially maintains linear output power despite load variations without significantly modifying the output stage of the power amplifier circuit.

As is well known by one skilled in the art, the changes in the forward and reflected power levels measured by the power detector 190 are related to changes in the load impedance, e.g., the impedance of the antenna 66 shown in FIG. 2. In particular, for a load impedance substantially matched to the output impedance of the output of the amplifier circuit 100, the ratio or the difference between the forward and reflected power levels is high, while it is low for substantially mismatched impedances. U.S. Pat. No. 5,423,082, which is incorporated herein by reference in its entirety, discloses a transmitter that includes a closed loop feedback to compensate for varying antenna loads without an isolator, which is accomplished by taking the reflected output energy into account to maintain a constant overall loop gain by adjusting the gain of variable gain stages.

Control circuits are also well known in the art, such as the control circuit disclosed in U.S. Pat. Nos. 5,442,322 and 5,712,593 which are incorporated herein by reference in its entirety. In U.S. Pat. No. 5,442,322, a bias control circuit compares a bias control voltage with a value indicative of the current in an active device and provides a control signal to the control terminal of the active device to control the operating point thereof. The bias point of a power amplifier is similarly controlled in U.S. Pat. No. 5,712,593 by a control circuit in response to comparing a reference value to a filtered portion of the RF output signal. Changing the amplifier bias point limits the effect of the load impedance variation on the amplifier performance. U.S. Pat. No. 6,064,266, which is incorporated herein by reference in its entirety, is also related to limiting the effect of the load impedance variation on the amplifier performance, which is achieved by modifying the RF output signal path, instead of the DC bias, by switching in a resistor in parallel with the output impedance when a threshold detector detects variations in the load impedance above a predetermined value. Phase shifters are also well known in the art, as disclosed in U.S. Pat. No. 4,312,032, which is incorporated herein by reference in its entirety.

The control circuit 145 of the present amplifier circuit 100 may include a processor or a comparator for comparing the values of forward and reflected power levels measured by the power detector 190 with at least one threshold value. Based on the comparison, the control circuit 145 selectively and independently controls modifies the DC levels at the inputs 142, 182 of the transistors 140, 180, as well as controlling the phase shifter 155 to change the phase of the pre-amplified signal as necessary, namely, as a function of the levels of the forward and reflected signals, to substantially maintain constant the linearity of the amplifier circuit 100 with load variations.

Figure 5:
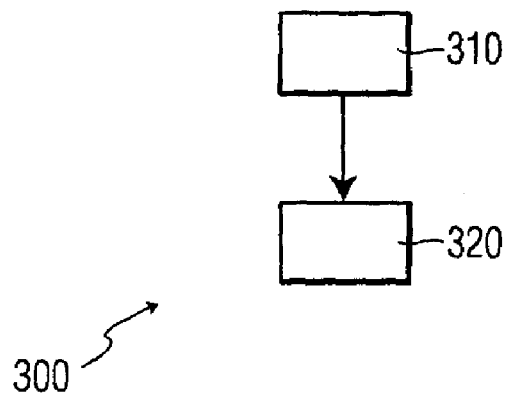
FIG. 5 shows a summarized flow chart of the method for preserving performance, e.g., linearity, of an isolator-free amplifier circuit according to the present invention.

FIG. 5 shows a flow chart 300 of a method for preserving performance of an isolator-free amplifier circuit according to the present invention. In block 310, the power detector measures the forward and reflected power levels at the output of the amplifier circuit and provides this information to the control circuit 145. In response to the measured forward and reflected power levels, such as their difference or ratio values, in block 320, the control circuit 145 selectively and independently controls the phase shifter 155 to change the phase of the pre-amplified signal, and/or modifies the gain, e.g., by changing the base DC bias, of the input and/or output transistors 140, 180, as a function of the measured forward and reflected power levels to substantially maintain optimal performance and constant linearity of the amplifier circuit 100 with load variations.

While the present invention has been described in particular detail with reference to specific exemplary embodiments thereof, it should also be appreciated that numerous modifications and changes may be made thereto without departing from the broader and intended spirit and scope of the invention as set forth in the claims that follow. The specification and drawings are accordingly to be regarded in an illustrative manner and are not intended to limit the scope of the claims which follow.

The invention claimed is:

1. An amplifier circuit comprising:
   a driver stage having at least a first active device which receives a signal for pre-amplification and outputs a pre-amplified signal;
   a phase shifter which adjusts a phase of said pre-amplified signal and outputs a phase-shifted signal;
   an output stage having at least a second active device which receives said phase-shifted signal for further amplification and output of an amplified signal;
   a detector which measures levels of forward signal and reflected signal of said amplified signal; and
   a control circuit that independently controls the first active device and the second active device, and which controls said phase shifter in response to said levels of forward signal and reflected signal to substantially maintain linearity of said amplifier circuit with load variations.

2. The amplifier circuit of claim 1, wherein said output stage is coupled to a load without an isolation device between said output stage and said load.

3. The amplifier circuit of claim 1, wherein said control circuit modifies a gain of at least one of said at least first active device and said at least second active device to substantially maintain said linearity of said amplifier circuit with said load variations.

4. The amplifier circuit of claim 1, wherein said control circuit controls said phase shifter independently of the first and second active devices.

5. The amplifier circuit of claim 1, wherein said at least first active device and said at least second active device are NPN transistors.

6. The amplifier circuit of claim 1, further comprising an input match circuit coupled between an input of said amplifier circuit and said driver stage for matching an input impedance of said amplifier circuit to an output impedance of a device coupled to said input.

7. The amplifier circuit of claim 6, further comprising at least one capacitor coupled between said input match circuit and said driver stage.

8. The amplifier circuit of claim 1, further comprising at least one capacitor coupled between an input of said amplifier circuit and said driver stage.

9. The amplifier circuit of claim 1, further comprising an inter-stage match circuit coupled between an output of said driver stage and an input of said phase shifter.

10. The amplifier circuit of claim 9, further comprising at least one capacitor coupled between said phase shifter and said output stage.

11. The amplifier circuit of claim 1, further comprising at least one capacitor coupled between said phase shifter and said output stage.

12. A wireless communication device comprising the amplifier circuit of claim 1.

13. An amplifier circuit comprising:
   a driver stage having at least a first active device which receives a signal for pre-amplification and outputs a pre-amplified signal;
   a phase shifter which adjusts a phase of said pre-amplified signal and outputs a phase-shifted signal;
   an output stage having at least a second active device which receives said phase-shifted signal for further amplification and output of an amplified signal;
   a detector which measures levels of forward signal and reflected signal of said amplified signal; and
   a control circuit which independently and selectively controls switching said phase shifter, said at least first active device, and said at least second active device as a function of said levels of forward signal and reflected signal to substantially maintain linearity of said amplifier circuit with load variations.

14. A method for substantially maintaining linearity of an amplifier circuit with variations of a load coupled to an output of said amplifier circuit comprising:
   measuring levels of forward signal and reflected signal at said output;
   modifying a phase shifter to change a phase of an output signal of said amplifier circuit as a function of said levels to substantially maintain linearity of said amplifier circuit with load variations; and
   modifying a first gain of a first active device of a driver stage and a second gain of a second active device of an output stage of said amplifier circuit in response to said levels.

15. The method of claim 14, wherein said modifying act independently and selectively modifies said phase shifter, said first gain and a second gain.

16. An amplifier circuit comprising:
   a driver stage having at least a first active device to receive a signal for pre-amplification and to output a pre-amplified signal;
   a phase shifter to adjust a phase of the pre-amplified signal and to output a phase-shifted signal;
   an output stage having at least a second active device to receive the phase-shifted signal for further amplification and output of an amplified signal;
   a capacitor coupled between the phase shifter and the output stage;
   a detector that measures levels of forward signal and reflected signal of the amplified signal; and
   a control circuit that controls said phase shifter in response to the levels of forward signal and reflected signal to substantially maintain linearity of the amplifier circuit with load variations.

* * * * *